United States Patent
Goel et al.

(10) Patent No.: US 10,878,891 B1
(45) Date of Patent: Dec. 29, 2020

(54) SRAM BITCELL SUPPLY BLOCK WITH MULTIPLE OPERATING MODES

(71) Applicant: Samsung Electronics Co., Ltd., Suwon-si (KR)

(72) Inventors: Sumeer Goel, Austin, TX (US); Kiran Koratikere Srinivasa, Austin, TX (US); Peter Normand Labrecque, Austin, TX (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/543,507

(22) Filed: Aug. 16, 2019

Related U.S. Application Data

(60) Provisional application No. 62/863,240, filed on Jun. 18, 2019.

(51) Int. Cl.
*G11C 5/14* (2006.01)
*G11C 11/412* (2006.01)
*G11C 11/413* (2006.01)

(52) U.S. Cl.
CPC .......... *G11C 11/412* (2013.01); *G11C 11/413* (2013.01)

(58) Field of Classification Search
CPC .............................. G11C 11/412; G11C 11/413
USPC ........................................................ 365/226
See application file for complete search history.

(56) References Cited

U.S. PATENT DOCUMENTS

| 8,351,279 | B2 | 1/2013 | Tang et al. |
| 8,520,429 | B2* | 8/2013 | Behrends .............. G11C 11/413 365/154 |
| 9,281,311 | B2 | 3/2016 | Wu et al. |
| 9,355,710 | B2 | 5/2016 | Gong et al. |
| 9,659,634 | B2 | 5/2017 | Liaw |
| 9,875,788 | B2 | 1/2018 | Jung et al. |
| 10,079,056 | B2 | 9/2018 | Gupta et al. |
| 2012/0206988 | A1* | 8/2012 | Song ..................... G11C 11/419 365/203 |
| 2015/0194208 | A1* | 7/2015 | Nagle ................... G11C 11/419 365/154 |

FOREIGN PATENT DOCUMENTS

KR 20190009143 A 1/2019

\* cited by examiner

*Primary Examiner* — Vu A Le
(74) *Attorney, Agent, or Firm* — Renaissance IP Law Group LLP

(57) ABSTRACT

A power-supply circuit for a memory includes a bitcell power-supply circuit and a bitcell power-control circuit. The bitcell power-supply circuit includes a first terminal coupled to a bitcell of the memory. The bitcell power-control circuit is coupled to the bitcell power-supply circuit, and controls the bitcell power-supply circuit in a write-assist mode to output a first voltage on the first terminal that is based on a ratio of capacitance of the bitcell and of capacitance of a charge-sharing capacitance. The bitcell power-control circuit further controls the bitcell power-supply circuit in a data-retention mode to output a second voltage on the first terminal that is about one diode drop below a voltage of a main power supply to the bitcell. The bitcell power-control circuit also controls the bitcell power-supply circuit in a power-down mode to turn off power output from the first terminal.

21 Claims, 7 Drawing Sheets

US 10,878,891 B1

SRAM BITCELL SUPPLY BLOCK WITH MULTIPLE OPERATING MODES

CROSS-REFERENCE TO RELATED APPLICATION

This application claims the priority benefit under 35 U.S.C. § 119(e) of U.S. Provisional Application No. 62/863,240, filed on Jun. 18, 2019, the disclosure of which is incorporated herein by reference in its entirety.

TECHNICAL FIELD

The subject matter disclosed herein relates to static random access memories (SRAMs). More specifically, the subject matter disclosed herein relates to a system and a method for providing a SRAM bitcell supply block that provides power to a SRAM bitcell using multiple operating modes.

BACKGROUND

Lower-voltage power supplies are a current trend within, for example, mobile devices and otherwise, which allows microprocessors within the devices to operate at lower voltages and consume less power. Generally, the lowest operating voltage (Vmin) for microprocessors may be set by the SRAM memories.

SUMMARY

An example embodiment provides a power-supply circuit for a memory that may include a bitcell power-supply circuit and a bitcell power-control circuit. The bitcell power-supply circuit may include a first terminal coupled to a bitcell of the memory. The bitcell power-control circuit may be coupled to the bitcell power-supply circuit, and may control the bitcell power-supply circuit in a write-assist mode to output a first voltage on the first terminal that is based on a ratio of capacitance of the bitcell and a charge-sharing capacitance. In one embodiment, the bitcell power-control circuit may further control the bitcell power-supply circuit in a data-retention mode to output a second voltage on the first terminal that is about one diode drop below a voltage of a main power supply to the bitcell. In still another embodiment, the bitcell power-control circuit may further control the charge-sharing capacitance to be discharged before the bitcell power-supply circuit outputs the first voltage on the first terminal. In yet another embodiment, the charge-sharing capacitance may include one or more charge-sharing capacitors.

An example embodiment provides a memory that may include a bitcell region and a bitcell power block. The bitcell region may include one or more bit cells. The bitcell power block may supply power to the bitcell region through a first terminal. In a write-assist mode, the bitcell power block may output a first voltage on the first terminal that is based on a ratio of capacitance of the bitcell region and a charge-sharing capacitance of the bitcell power block. In a data-retention mode, the bitcell power block may further output a second voltage on the first terminal that is about one diode drop below a voltage of a main power supply to the memory. In a normal mode, the bitcell power block may further output a third voltage on the first terminal that is substantially a voltage of a main power supply for the bitcell region. In a power-down mode, the bitcell power block further turns off power output from the first terminal. The first terminal may float in a power-down mode.

An example embodiment provides a power-supply circuit for a memory that may include a bitcell power-supply circuit and a bitcell power-control circuit. The bitcell power-supply circuit may include a first terminal, a second terminal and a power-header transistor. The first terminal may be coupled to a main power supply of the memory. The second terminal may be coupled to a bitcell of the memory. The power-header transistor may be coupled between the first terminal and the second terminal. The bitcell power-control circuit may be coupled to the bitcell power-supply circuit and may control the bitcell power-supply circuit. The bitcell power-control circuit may be configured to: control the bitcell power-supply circuit in a write-assist mode to output a first voltage on the second terminal that is based on a ratio of capacitance of the bitcell and a charge-sharing capacitance, control the bitcell power-supply circuit in a data-retention mode to output a second voltage on the second terminal that is about one diode drop below a voltage of the main power supply to the bitcell, control the bitcell power-supply circuit in a normal mode to output a third voltage on the second terminal that is substantially a voltage of a main power supply for the bitcell, and control the bitcell power-supply circuit in a power-down mode to turn off power output from the second terminal. In one embodiment, the charge-sharing capacitance may include one or more charge-sharing capacitors. In another embodiment, the second terminal floats in the power-down mode. In still another embodiment, the memory may include a static random access memory (SRAM).

BRIEF DESCRIPTION OF THE DRAWING

In the following section, the aspects of the subject matter disclosed herein will be described with reference to exemplary embodiments illustrated in the figure, in which.

DETAILED DESCRIPTION

Figure 1:
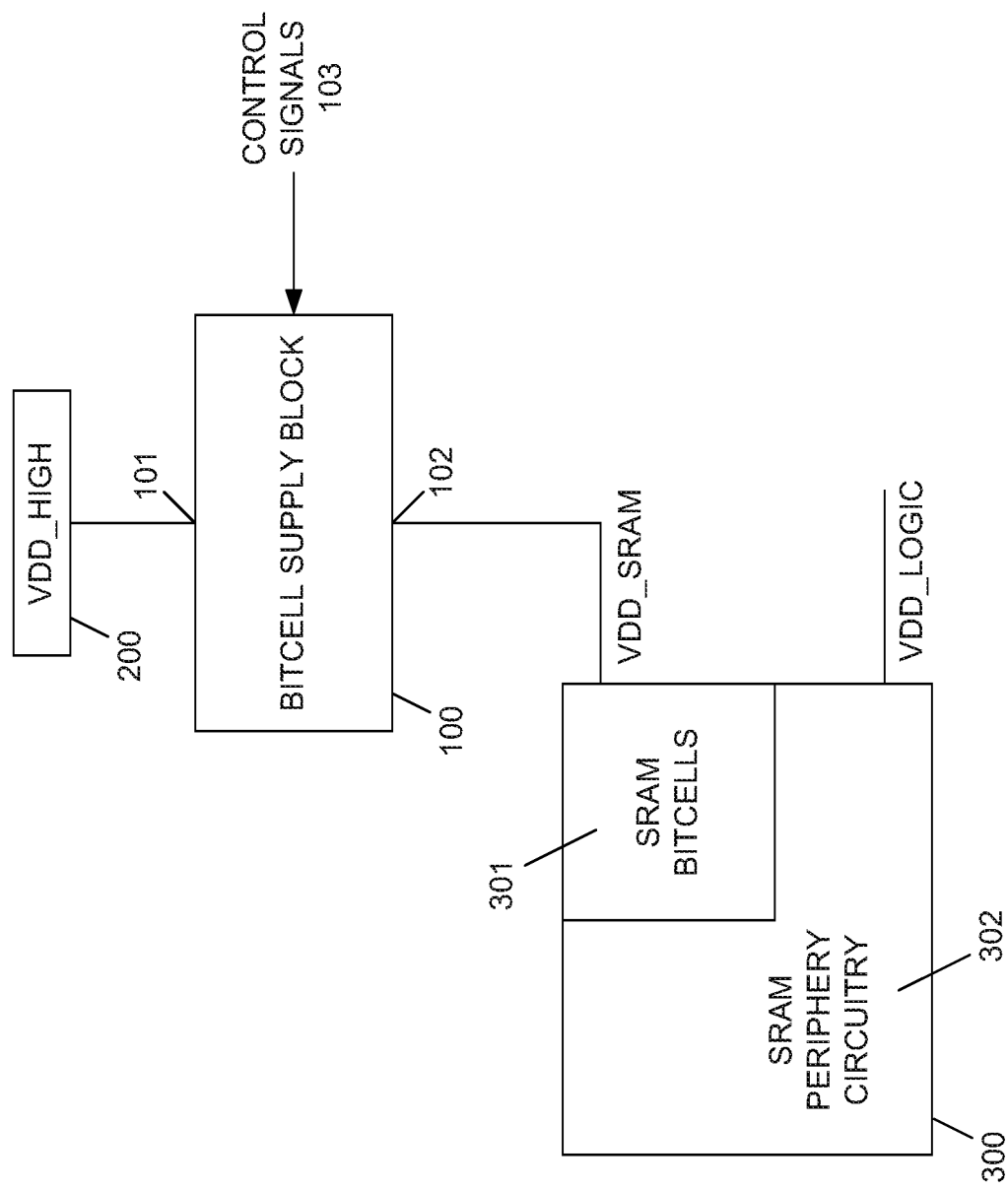
FIG. 1 depicts a block diagram of an example embodiment of a bitcell supply block in relationship to a main power supply and a SRAM according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. The software may be embodied as a software package, code and/or instruction set or instructions, and the term "hardware," as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC) and so forth. The various components and/or functional blocks disclosed herein may be embodied as modules that may include software, firmware and/or hardware that provide functionality described herein in connection with the various components and/or functional blocks.

The subject matter disclosed herein relates to a SRAM bitcell supply block (or module) that may include a bitcell power-control circuit (or module) and a bitcell power-supply circuit (or module). In one embodiment the bitcell power-control circuit may include combinational logic devices to produce intermediate control signals. In one embodiment, the bitcell power-control circuit receives the intermediate control signals and provides four modes of operation that are used to supply power to the bitcells of a SRAM: a normal mode, a write-assist mode, a data-retention mode, and a power-down mode. The normal mode and the write-assist mode are active modes and may be used for accessing the SRAM bitcells during a write operation. The data-retention mode and the power-down mode may be used as sleep-type modes to reduce power consumption of the SRAM when not in an active mode. Peripheral circuitry for the SRAM bitcells may be powered differently from the bitcells.

In the normal mode, a transistor in the bitcell power-supply circuit may connect a bitcell supply VDD_SRAM to a VDD_HIGH supply. In the write-assist mode, a transistor may disconnect the bitcell supply VDD_SRAM from the VDD_HIGH, and additional transistors may enable a charge-sharing arrangement between a floating VDD_SRAM supply and pre-discharged charge-sharing capacitance, thereby lowering the VDD_SRAM level to a VDD_LOW. In one embodiment, multiple extra-margin-adjust capacitors may be included that may be used to change the amount charge-sharing capacitance and modulate a level of VDD_SRAM.

In the data-retention mode, a transistor may disconnect the VDD_SRAM supply from the VDD_HIGH supply. The VDD_SRAM may then decay, or discharge, to a voltage lower than the VDD_HIGH supply, and a diode device may turn ON when VDD_SRAM leaks to a Vt drop below the VDD_HIGH supply. In the power-down mode, a transistor may disconnect a VDD_SRAM supply output from to the bitcell from VDD_HIGH supply so that the VDD_SRAM may float during the power-down mode.

FIG. 1 depicts a block diagram of an example embodiment of a bitcell supply block 100 in relationship to a main power supply 200 and a SRAM 300 according to the subject matter disclosed herein. An input node 101 to the bitcell supply block 100 may be coupled to the main power supply 200, which may supply a VDD_HIGH voltage. A VDD_SRAM output node 102 of the bitcell supply block 100 may be coupled to the SRAM 300. Control signals 103 may be input the bitcell supply block 100 to control the output of the node 102 depending on the particular operational mode of the SRAM 300. The SRAM 300 may include one or more SRAM bitcells 301 and SRAM periphery circuitry 302. In one embodiment, the bitcells 301 may be high-density SRAM bitcells. The SRAM periphery circuitry 302 may be powered from a VDD_Logic power source that may be different from the output at node 102 of the bitcell supply block 100.

Figure 2:
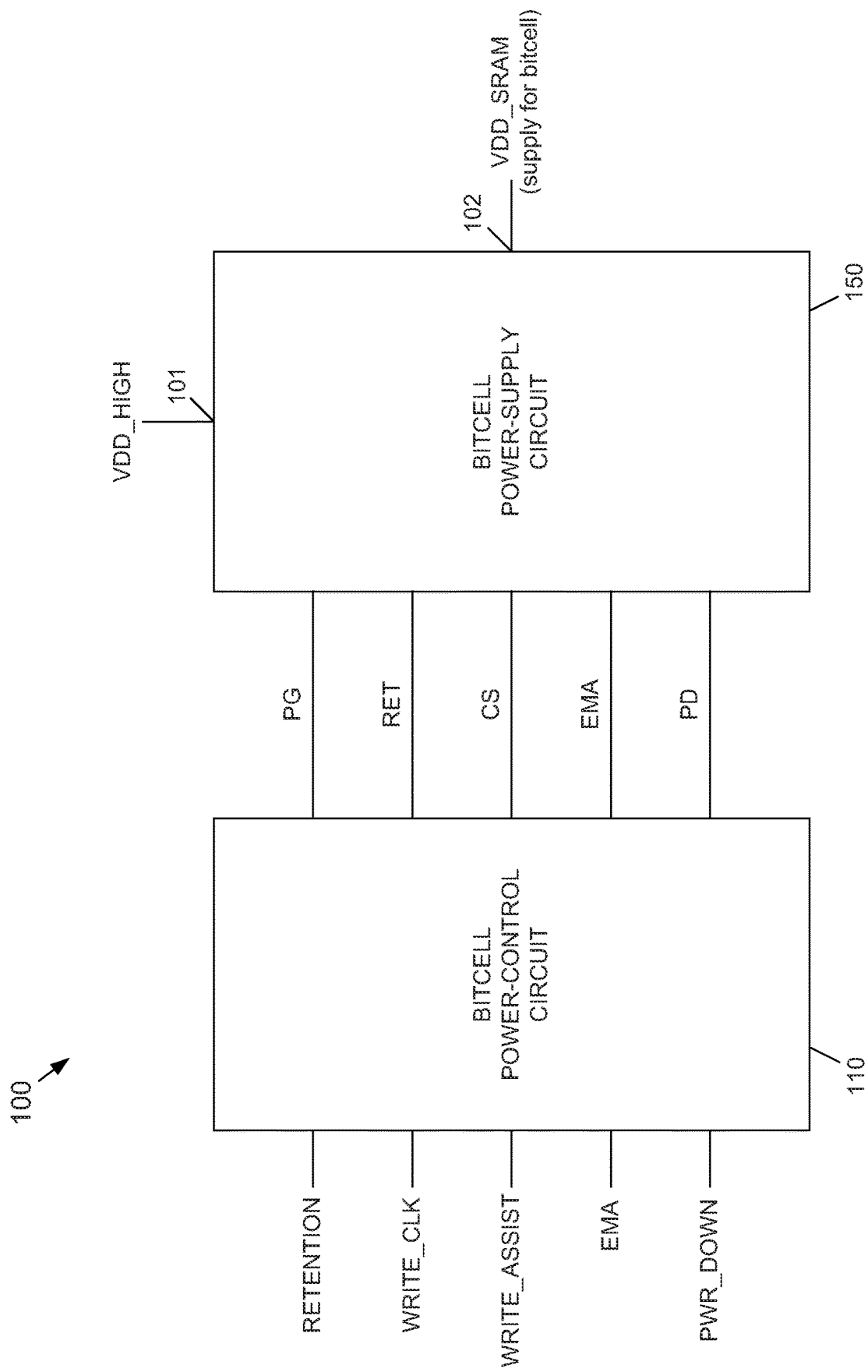
FIG. 2 depicts a more detailed block diagram of an example embodiment of the bitcell supply block depicted in FIG. 1 according to the subject matter disclosed herein.

FIG. 2 depicts a more detailed block diagram of an example embodiment of the bitcell supply block 100 according to the subject matter disclosed herein. The bitcell supply block 100 may include a bitcell power-control circuit 110 and a bitcell power-supply circuit 150. The bitcell power-control circuit 110 may receive a retention control signal, a write clock (WRITE_CLK) control signal, a write assist (WRITE_ASSIST) control signal, an extra margin adjust (EMA) control signal, and a power down (PWR_DWN) control signal. The retention, WRITE_CLK, WRITE_ASSIST, EMA and PWR_DOWN control signals may be included in the control signals 130 indicated in FIG. 1.

The bitcell power-control circuit 110 may output a PG control signal, a retention (RET) control signal, a charge-sharing (CS) control signal, a power-discharge (PD) control signal, and an EMA control signal. The control signals output from the bitcell power-control circuit 110 may be input to the bitcell power-supply circuit 150, and may be used to control the output appearing at the VDD_SRAM output 102. The bitcell power-supply circuit 150 may also receive VDD_HIGH from the main power supply 200 (FIG. 1) at the input node 101.

Figure 3:
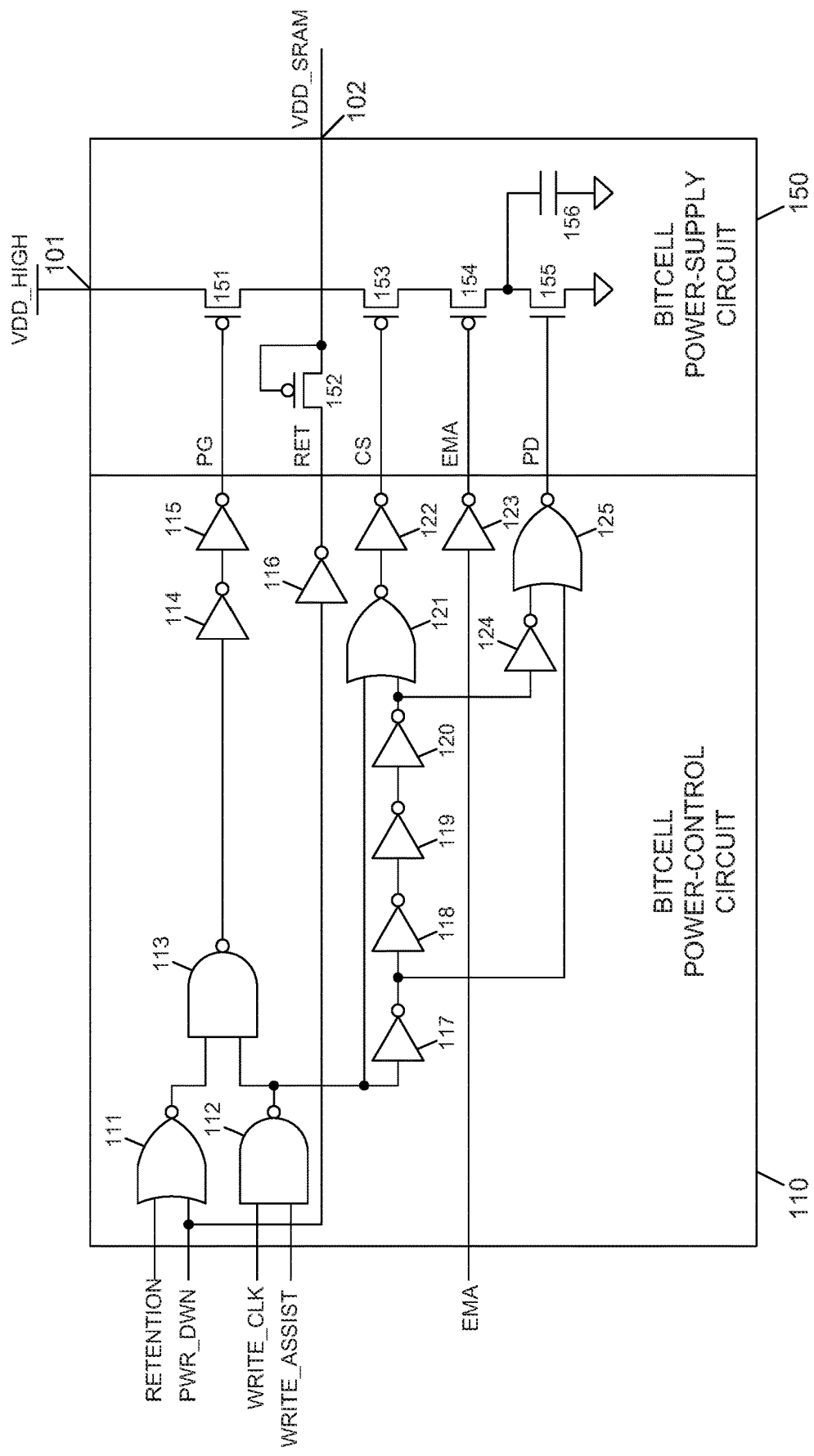
FIG. 3 depicts a schematic diagram of an example embodiment of the bitcell power-control circuit and the bitcell power-supply circuit according to the subject matter disclosed herein.

FIG. 3 depicts a schematic diagram of an example embodiment of the bitcell power-control circuit 110 and the bitcell power-supply circuit 150 according to the subject matter disclosed herein. The bitcell power-control circuit 110 may include NOR gates 111, 121 and 125, NAND gates 112 and 113, and inverters 114, 115-120, and 122-124. The bitcell power-supply circuit 150 may include p-channel metal-oxide-semiconductor field-effect transistors (MOSFETs) 151-154, an n-channel MOSFET 155, and a capacitor 156.

In the bitcell power-control circuit 110, the NOR gate 111 receives the retention and the PWR_DWN control signals. The NAND gate 112 receives the WRITE_CLK and the WRITE_ASSIST control signals. The output of the NOR gate 111 is coupled to a first input of the NOR gate 113. The output of the NAND gate 112 is coupled to a second input of the NOR gate 113. The output of the NOR gate 113 is coupled to the input of the inverter 114. The output of inverter 114 is coupled to the input of the inverter 115. The output of the inverter 115 outputs the PG control signal.

The PWR_DWN control signal is also coupled to the input of the inverter 116. The output of the inverter 116 outputs the RET control signal.

The output of the NAND gate 112 is also coupled to the input of the inverter 117 and to a first input of the NOR gate 121. The output of the inverter 117 is coupled to the input of the inverter 118. The output of the inverter 118 is coupled to the input of the inverter 119. The output of the inverter 119 is coupled to the input of the inverter 120. The output of the inverter 120 is coupled to a second input of the NOR gate 121. The output of the NOR gate 121 is coupled to the input of the inverter 122. The output of the inverter 122 is the CS control signal.

The EMA control signal input to the bitcell power-control circuit 110 is coupled to the input of the inverter 123. The output of the inverter 123 is the EMA control signal that is input to the bitcell power-supply circuit 150.

The output of the inverter 117 is also coupled to a first input of the NOR gate 125. The output of the inverter 120 is also coupled to the input of the inverter 124. The output of the inverter 124 is coupled to a second input of the NOR gate 125. The output of the NOR gate 125 is the PD control signal.

In the bitcell power-supply circuit 150, the transistor 151 includes a first terminal coupled to the VDD_HIGH input 101, a second terminal coupled to the VDD_SRAM output 102, and a third terminal coupled to the PG control signal output from the inverter 115. The transistor 152 includes a first terminal coupled to the VDD_SRAM output node 102, a second terminal coupled to the RET output from the inverter 116, and a third terminal coupled to the first terminal of the transistor 152 and the VDD_SRAM output node 102. The transistor 152 is configured as a diode.

The transistor 153 includes a first terminal coupled to the VDD_SRAM output node 102, a second terminal coupled to a first terminal of the transistor 154, and a third terminal coupled to the CS control output from the inverter 122. The transistor 154 includes the first terminal coupled to the second terminal of the transistor 153, a second terminal coupled to a first terminal of the transistor 155, and a third terminal coupled to the EMA control signal output from the inverter 123.

The transistor MOSFET 155 includes a first terminal coupled to the second terminal of the transistor 154, a second terminal coupled to ground, and a third terminal coupled to the PD control signal output from the NOR gate 125. A capacitor 156 includes a first terminal coupled to the first terminal of the transistor, and a second terminal coupled to ground.

Together the bitcell power-control circuit 110 and the bitcell power-supply circuit 150 provide four modes of operation so that the SRAM bit cells 301 (FIG. 1) may operate reliably as operating voltages decrease in devices, such as, but not limited to, mobile devices. The first and second operating modes are both active-type modes. The first operating mode, referred to herein as the normal mode, allows the SRAM bitcells 301 to operate directly or substantially directly from the VDD_HIGH voltage. The bitcell power-control circuit 110 is configured to turn the transistor 151 on and the transistors 152-155 off so that the VDD_HIGH voltage is connected to the VDD_SRAM output node 102. Table 1 sets forth the configuration of the control signals for the normal operating mode.

TABLE 1

Input Control Signals for Modes of Operation.

| MODE | Write-Assist | Retention | PWR_DWN | EMA |
| --- | --- | --- | --- | --- |
| Normal | 0 | 0 | 0 | X |
| Write-Assist | 1 | 0 | 0 | 1 |
| Data-Retention | 0 | 1 | 0 | X |
| Power-Down | 0 | 0 | 1 | X |

In Table 1, the first column sets forth the particular operating mode. The second through fifth columns indicates the state of the different control signals input to the bitcell power-control circuit 110 for the particular operating mode. An "X" represents a do-not-care state.

In the second operating mode, referred to herein as the write-assist mode, during a write operation the SRAM bitcells 301 operate at a VDD_LOW voltage that is lower than the VDD_SRAM voltage to enable writing to the bitcell. This may be accomplished by charge sharing between the VDD_SRAM node and the capacitor 156. That is, the VDD_LOW voltage may be based on a ratio of the capacitance of the bitcell 301 as seen from the node 102 and capacitance of the capacitor 156. Table 1 sets forth the configuration of the control signals for the write-assist mode.

Figure 4:
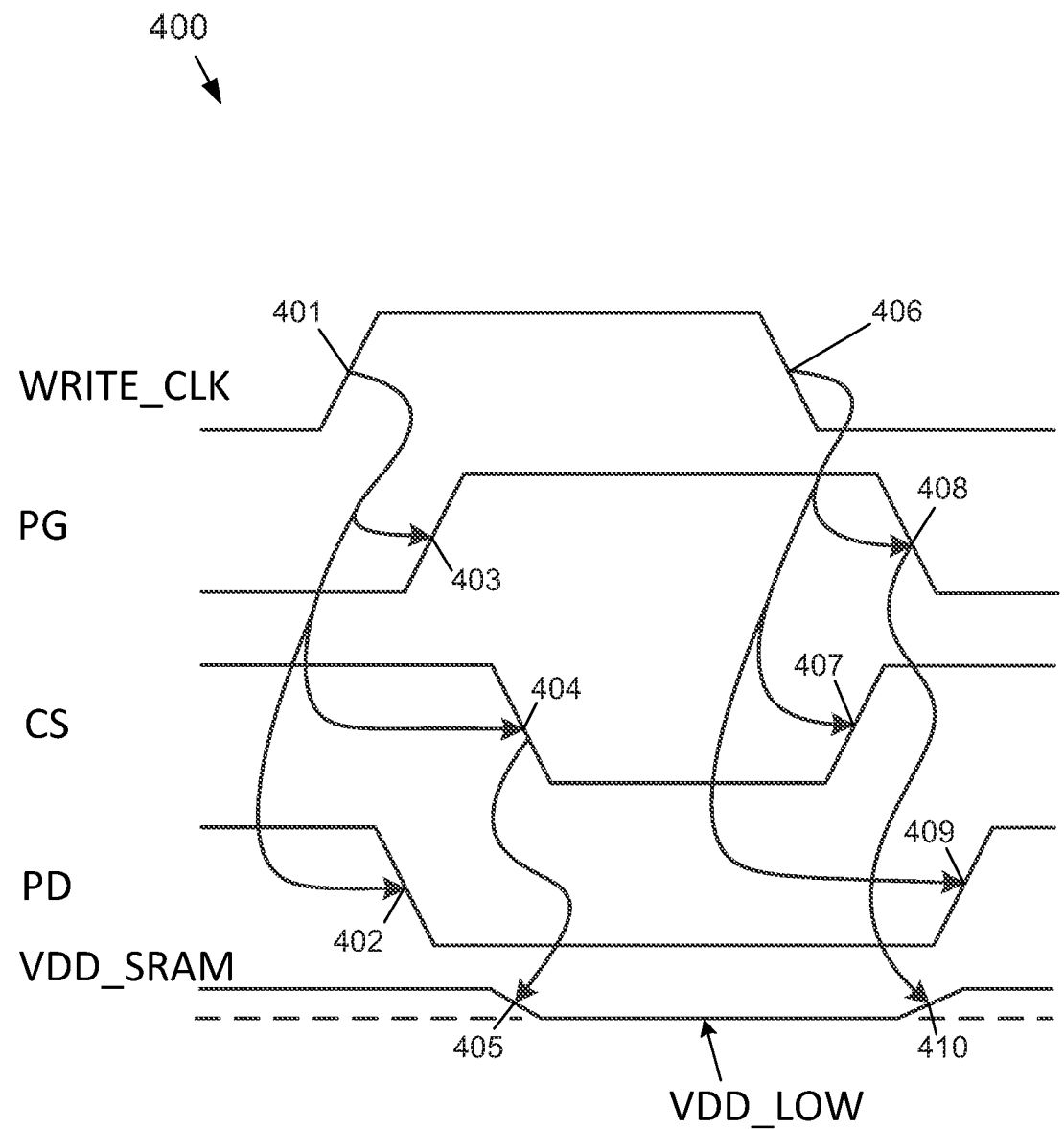
FIG. 4 depicts an example timing sequence for several of the control signals output from a bitcell power-control circuit according to the subject matter disclosed herein.

FIG. 4 depicts an example timing sequence 400 for several of the control signals output from the bitcell power-control circuit 110. Initially, the transistor 151 is on, and the transistors 152 and 153 are off. The transistor 155 is on, so the capacitor 156 is discharged. VDD_SRAM is at VDD_HIGH. The transistor 154 is always on for this embodiment.

At 401, the WRITE_CLK control signal goes high. In response to the rising edge of the WRITE_CLK control signal, the PD control signal goes low at 402 to turn the transistor 155 off. The PG control signal goes high at 403, turning the transistor 151 off. The CS control signal goes low at 404, turning the transistor 153 on. The EMA control signal input to the bitcell power-supply circuit 150 (not shown in FIG. 4) is always low for this embodiment so that the transistor 154 is on. In response to the CS control signal going low at 404, the VDD_SRAM voltage output at node 102 of the bitcell supply block drops to VDD_LOW at 405. The voltage level of VDD_LOW is based on charge sharing between the SRAM bitcell 301 as seen at VDD_SRAM node 102 and the capacitor 156. That is, VDD_LOW is based the ratio of the capacitance of the bitcell 301 as seen at the node 102 and capacitance of the capacitor 156.

At 406, the WRITE_CLK control signal goes low. In response to the falling edge of the WRITE_CLK control signal, the CS control signal goes high at 407, turning transistor 153 off and disconnecting the capacitor 156 from the VDD_SRAM node 102. The PG control signal goes low at 408, turning the transistor 151 on and connecting the VDD_SRAM node 102 to VDD_HIGH. The PD control signal goes high at 409, turning the transistor 155 on and discharging the capacitor 156. At 410, the VDD_SRAM signal rises from VDD_LOW to the higher voltage of VDD_HIGH.

In the write-assist mode, the SRAM periphery 302 may be active, although power is not supplied to the SRAM periphery 302 by the bitcell supply block 100. The SRAM periphery 302 may receive power through a VDD_LOGIC power system.

The third and fourth operating modes are sleep-type modes. The third operating mode, referred to herein as the data-retention mode, supplies the SRAM bitcells 301 with an operating voltage that is lower than VDD_HIGH so that data in the SRAM bitcells 301 is retained in this sleep mode. The SRAM bitcells 301 are not accessed in this mode of operation. The transistor 151 is turned off and the voltage of the VDD_SRAM node 102 is lowered by the transistor 152, which is configured as a diode clamp device. Table 1 sets forth the configuration of the control signals for the data-retention mode.

The fourth operating mode is referred to herein as the power-down mode. In the fourth operating mode, power is disconnected, or turned off, from the SRAM bitcells 301, which are not accessed in the power-down mode. Normally, power would also be disconnected, or turned off, for the SRAM periphery. The transistor 151 is turned off and VDD_SRAM node will drop, or decay, down to potentially ground. Table 1 sets forth the configuration of the control signals for the power-down mode.

Figure 5:
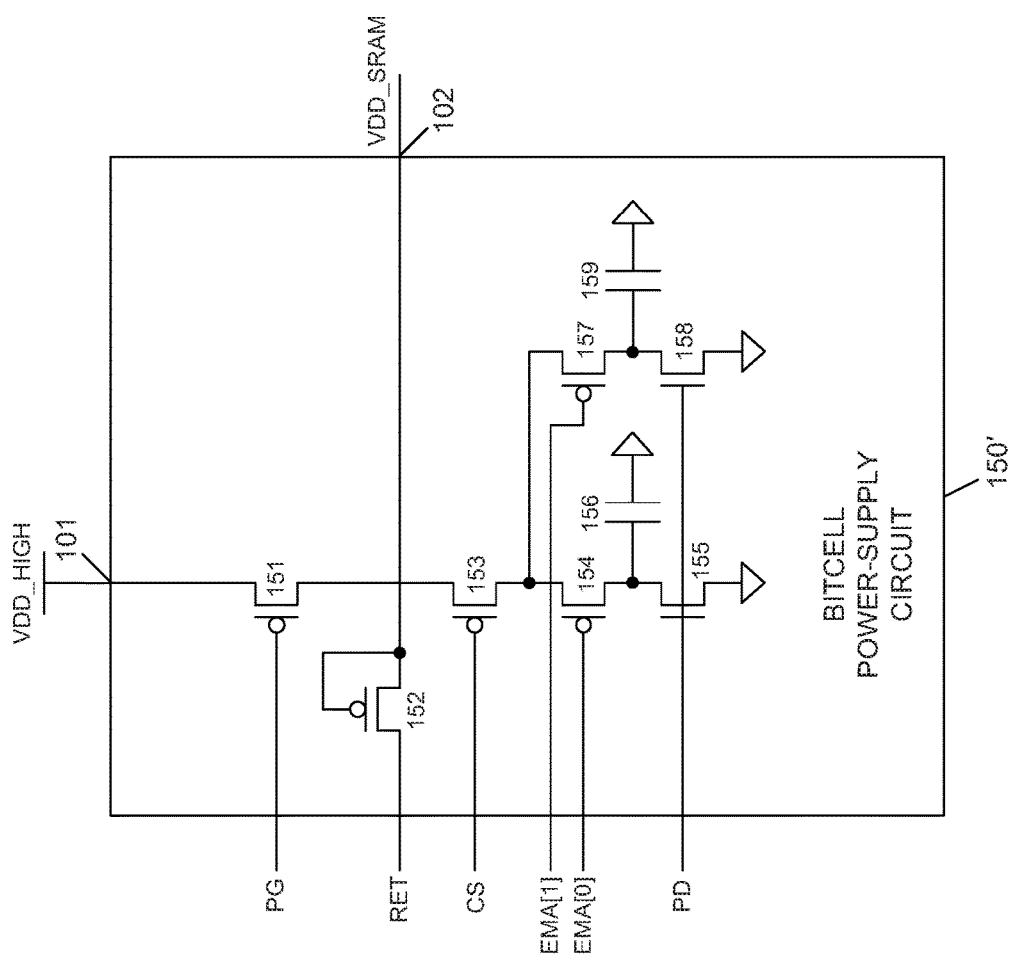
FIG. 5 depicts a schematic diagram of an alternative embodiment of the bitcell power-supply circuit that may include multiple charge-sharing capacitors according to the subject matter disclosed herein.

FIG. 5 depicts a schematic diagram of an alternative embodiment of the bitcell power-supply circuit 150' that may include multiple charge-sharing capacitors according to the subject matter disclosed herein. The bitcell power-supply circuit 150' includes the same components at the bitcell power-supply circuit 150 depicted in FIG. 3 with the addition of a p-channel MOSFET 157, an n-channel MOSFET 158 and a second capacitor 159. The transistor 157 includes a first terminal coupled to the first terminal of the transistor 154, a second terminal coupled to a first terminal of the transistor 158 and a first terminal of the capacitor 159, and a third terminal coupled to an EMA[1] control signal input to the bitcell power-supply circuit 150'. The transistor 158 includes the first terminal coupled to the second terminal of the transistor 157, a second terminal coupled to ground, and a third terminal coupled to the PD control signal. The capacitor 159 includes the first terminal coupled to the second terminal of the transistor 157 and the first terminal of the transistor 158, and a second terminal coupled to ground. The capacitor 159 may have a different value of capacitance than the capacitor 156.

In the alternative embodiment depicted in FIG. 5, an EMA[0] control signal is coupled to the third terminal of the transistor 154. The EMA[0] and the EMA[1] control signals may separately control the transistors 154 and 157 so that the capacitors 156 and 159 may be coupled into the circuit 150' together or separately. For example, if EMA[1:0]=00, both capacitors 156 and 159 are coupled into the circuit 150' together and there will be a greater voltage drop at VDD_SRAM node 102. If EMA[1:0]=01, the capacitor 159 is coupled into the circuit 150' while the capacitor 156 is not coupled into the circuit 150'. If EMA[1:0]=10, capacitor 156 is coupled into the circuit 150' and the capacitor 159 is not coupled into the circuit 150'. If EMA[1:0]=11, both of the capacitors 159 and 156 are not coupled into the circuit 150'. In yet other alternative embodiments, any number of capacitors may be used to vary how much capacitance is coupled to the VDD_SRAM node 102. Each additional capacitor would include transistors corresponding to the transistors 157 and 158, and would be controlled by a corresponding EMA control signal.

Figure 6:
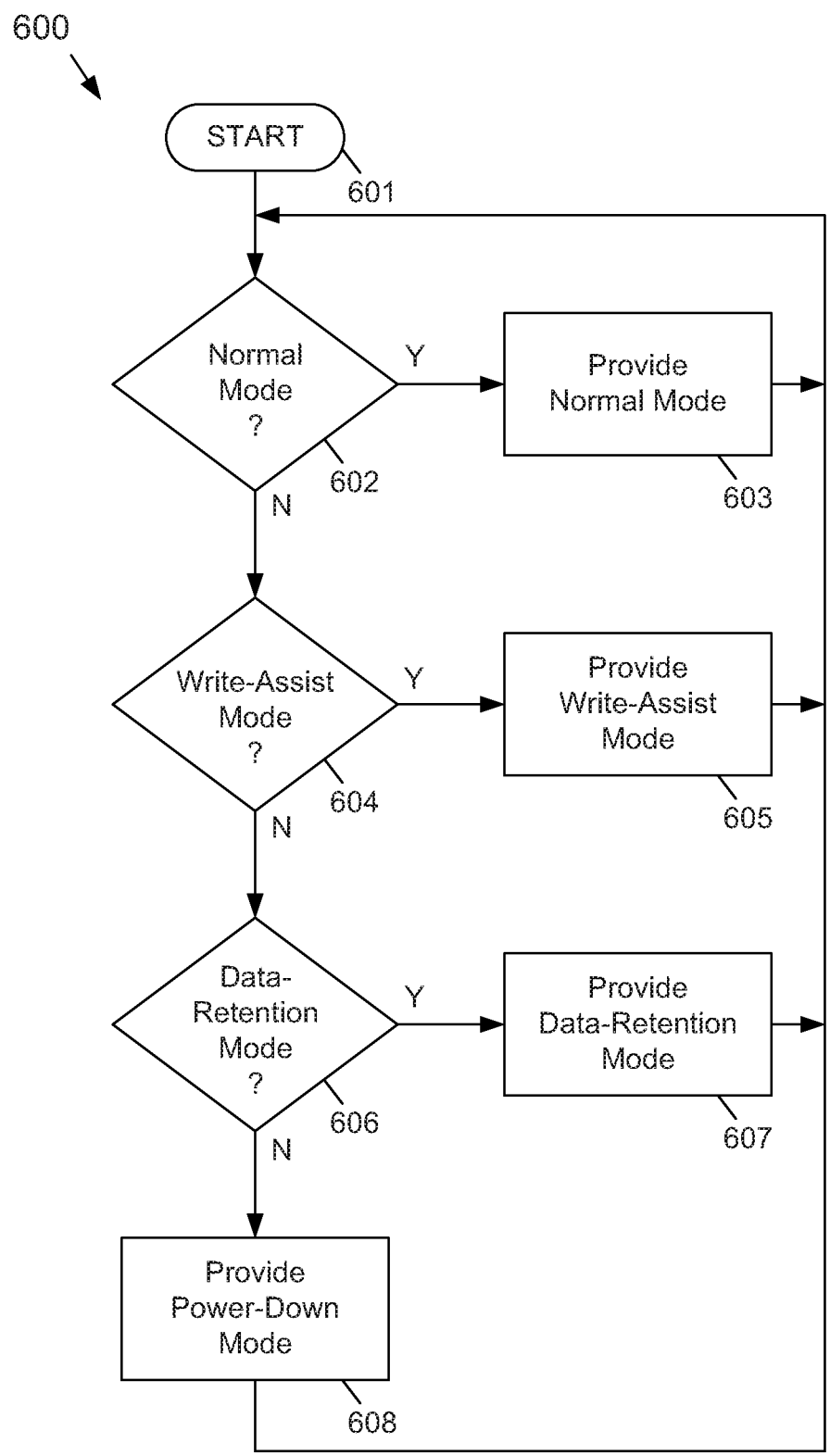
FIG. 6 is a flowchart for an example method of providing the four operating modes of power-supply voltages to a SRAM bitcell according to the subject matter disclosed herein.

FIG. 6 is a flowchart 600 for an example method of providing the four operating modes of power-supply voltages to a SRAM bitcell according to the subject matter disclosed herein. The process starts at 601. At 602, it is determined based on the control signals input to the bitcell supply-control circuit 110 whether the bitcell supply block 100 and the SRAM 300 is in the normal mode. If so, flow continues to 603 where the normal mode is provided; otherwise flow continues to 604. Flow then returns to 605.

At 604, it is determined based on the control signals input to the bitcell supply-control circuit 110 whether the bitcell supply block 100 and the SRAM 300 is in the write-assist mode. If so, flow continues to 605 where the write-assist mode is provided; otherwise flow continues to 606. Flow then returns to 602.

At 606, it is determined based on the control signals input to the bitcell supply-control circuit 110 whether the bitcell supply block 100 and the SRAM 300 is in the data-retention mode. If so, flow continues to 607 where the data-retention mode is provided; otherwise flow continues to 608 where the power-down mode is provided. Flow returns to 602.

Figure 7:
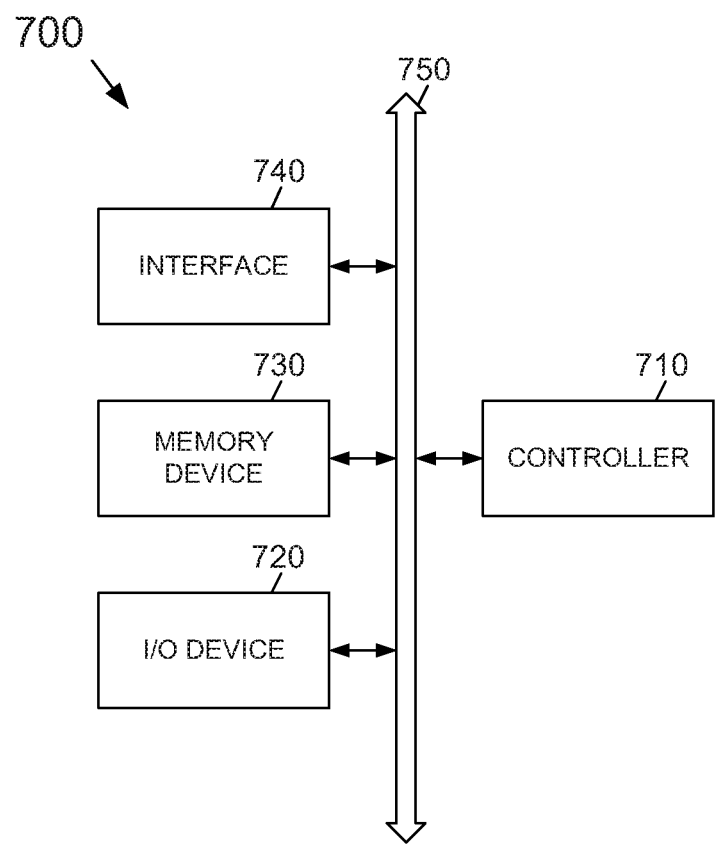
FIG. 7 depicts an electronic device that includes a SRAM bitcell supply block according to the subject matter disclosed herein.

FIG. 7 depicts an electronic device 700 that includes a SRAM bitcell supply block according to the subject matter disclosed herein. Electronic device 700 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 700 may include a controller 710, an input/output device 720 such as, but not limited to, a keypad, a keyboard, a display, a touch-screen display, a camera, and/or an image sensor, a memory 730, and an interface 740 that are coupled to each other through a bus 750. The controller 710 may include, for example, at least one microprocessor, at least one digital signal process, at least one microcontroller, or the like. The memory 730 may be configured to store a command code to be used by the controller 710 or a user data.

Electronic device 700 and the various system components of electronic device 700 may include a SRAM bitcell supply block according to the subject matter disclosed herein. The interface 740 may be configured to include a wireless interface that is configured to transmit data to or receive data from a wireless communication network using a RF signal. The wireless interface 740 may include, for example, an antenna, a wireless transceiver and so on. The electronic system 700 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices).

The operations described in this specification may be implemented as operations performed by a data-processing apparatus on data stored on one or more computer-readable storage devices or received from other sources.

The term "data-processing apparatus" encompasses all kinds of apparatus, devices and machines for processing data, including by way of example, a programmable processor, a computer, a system on a chip, or multiple ones, or combinations, of the foregoing The apparatus may include special-purpose logic circuitry, e.g., an FPGA (field programmable gate array) or an ASIC (application-specific integrated circuit). The apparatus may also include, in addition to hardware, code that creates an execution environment for the computer program, e.g., code that constitutes processor firmware, a protocol stack, a database-management system, an operating system, a cross-platform runtime environment, a virtual machine, or a combination thereof. The apparatus and execution environment may realize various different computing model infrastructures, such as web services, distributed computing and grid computing infrastructures.

A computer program (also known as a program, software, software application, script, or code) may be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform actions by operating on input data and generating output. The processes and logic flows may also be performed by, and apparatus can also be implemented as, special-purpose logic circuitry, e.g., an FPGA (field programmable gate array) or an ASIC (application-specific integrated circuit).

Processors suitable for the execution of a computer program include, by way of example, both general-purpose and special-purpose microprocessors, and any one or more processors of any kind of digital computer. Generally, a processor may receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. A computer, however, need not have such devices. Moreover, a computer may be embedded in another device, e.g., a mobile telephone, a personal-digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in, special-purpose logic circuitry.

To provide for interaction with a user, embodiments of the subject matter described in this specification may be implemented on a computer having a display device, e.g., a CRT (cathode ray tube) or LCD (liquid crystal display) monitor, for displaying information to the user and a keyboard and a pointing device, e.g., a mouse or a trackball, with which the user can provide input to the computer. Other kinds of devices can be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the subject matter described in this specification may be implemented in a computing system that includes a back-end component, e.g., as a data server, or that includes a middleware component, e.g., an application server, or that includes a front-end component, e.g., a user computer having a graphical user interface or a Web browser through which a user may interact with an implementation of the subject matter described in this specification, or any combination of one or more such back-end, middleware, or front-end components. The components of the system may be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system may include users and servers. A user and a server are generally remote from each other and typically interact through a communication network. The relationship of user and server arises by virtue of computer programs running on the respective computers and having a user-server relationship to each other.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments may also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims may be performed in a different order and still achieve desirable results. In addition, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A power-supply circuit for a memory, comprising:
   a bitcell power-supply circuit comprising a first terminal coupled to a bitcell of the memory; and
   a bitcell power-control circuit coupled to the bitcell power-supply circuit, the bitcell power-control circuit controlling the bitcell power-supply circuit in a write-assist mode to output a first voltage on the first terminal that is based on a ratio of capacitance of the bitcell and a charge-sharing capacitance, the bitcell power-control circuit further controlling the charge-sharing capacitance to be discharged before the bitcell power-supply circuit outputs the first voltage on the first terminal.

2. The power-supply circuit of claim 1, wherein the bitcell power-control circuit further controls the bitcell power-supply circuit in a data-retention mode to output a second voltage on the first terminal that is about one diode drop below a voltage of a main power supply to the bitcell.

3. The power-supply circuit of claim 1, wherein the charge-sharing capacitance comprises one or more charge-sharing capacitors.

4. The power-supply circuit of claim 1, wherein the bitcell power-control circuit further controls the bitcell power-supply circuit in a normal mode to output a third voltage on the first terminal that is substantially a voltage of a main power supply for the bitcell.

5. The power-supply circuit of claim 4, wherein the bitcell power-control circuit further controls the bitcell power-supply circuit in a power-down mode to turn off power output from the first terminal.

6. The power-supply circuit of claim 5, wherein the first terminal floats in the power-down mode.

7. The power-supply circuit of claim 5, wherein the bitcell power-supply circuit further comprises a power-header transistor coupled between the main power supply and the first terminal, and
wherein the bitcell power-control circuit controls the power-header transistor to turn off in the power-down mode.

8. The power-supply circuit of claim 1, wherein the memory comprises a static random access memory (SRAM).

9. A memory, comprising:
a bitcell region comprising one or more bit cells; and
a bitcell power block that supplies power to the bitcell region through a first terminal, in a write-assist mode the bitcell power block outputting a first voltage on the first terminal that is based on a ratio of capacitance of the bitcell region and a charge-sharing capacitance of the bitcell power block, the charge-sharing capacitance being discharged prior to the bitcell power block outputting the first voltage on the first terminal.

10. The memory of claim 9, wherein in a data-retention mode the bitcell power block further outputs a second voltage on the first terminal that is about one diode drop below a voltage of a main power supply to the memory.

11. The memory of claim 9, wherein the charge-sharing capacitance comprises one or more charge-sharing capacitors.

12. The memory of claim 9, wherein in a normal mode the bitcell power block further outputs a third voltage on the first terminal that is substantially a voltage of a main power supply for the bitcell region.

13. The memory of claim 12, wherein in a power-down mode the bitcell power block further turns off power output from the first terminal.

14. The memory of claim 13, wherein the first terminal floats in the power-down mode.

15. The memory of claim 9, wherein the bitcell power block comprises:
a bitcell power-supply circuit comprising the first terminal; and
a bitcell power-control circuit coupled to the bitcell power-supply circuit, the bitcell power-control circuit configured to:
control the bitcell power-supply circuit in the write-assist mode to output the first voltage on the first terminal,
control the bitcell power-supply circuit in a data-retention mode to output a second voltage on the first terminal that is about one diode drop below a voltage of a main power supply to the bitcell region,
control the bitcell power-supply circuit in a normal mode to output a third voltage on the first terminal that is substantially a voltage of a main power supply for the bitcell region, and
control the bitcell power-supply circuit in a power-down mode to turn off power output from the first terminal.

16. The memory of claim 15, wherein the bitcell power-supply circuit further comprises a power-header transistor coupled between the main power supply and the first terminal, and
wherein the bitcell power-control circuit controls the power-header transistor to turn off in the power-down mode.

17. The memory of claim 9, wherein the memory comprises a static random access memory (SRAM).

18. A power-supply circuit for a memory, comprising:
a bitcell power-supply circuit comprising a first terminal, a second terminal and a power-header transistor, the first terminal being coupled to a main power supply of the memory, the second terminal being coupled to a bitcell of the memory, and the power-header transistor being coupled between the first terminal and the second terminal; and
a bitcell power-control circuit coupled to and controlling the bitcell power-supply circuit, the bitcell power-control circuit being configured to:
control the bitcell power-supply circuit in a write-assist mode to output a first voltage on the second terminal that is based on a ratio of capacitance of the bitcell and a charge-sharing capacitance,
control the bitcell power-supply circuit in a data-retention mode to output a second voltage on the second terminal that is about one diode drop below a voltage of the main power supply to the bitcell,
control the bitcell power-supply circuit in a normal mode to output a third voltage on the second terminal that is substantially a voltage of a main power supply for the bitcell, and
control the bitcell power-supply circuit in a power-down mode to turn off power output from the second terminal.

19. The power-supply circuit of claim 18, wherein the charge-sharing capacitance comprises one or more charge-sharing capacitors.

20. The power-supply circuit of claim 18, wherein the second terminal floats in the power-down mode.

21. The power-supply circuit of claim 18, wherein the memory comprises a static random access memory (SRAM).

* * * * *